US012609277B2

(12) United States Patent
Tanaka et al.

(10) Patent No.: US 12,609,277 B2
(45) Date of Patent: Apr. 21, 2026

(54) METHOD FOR DETERMINING AMOUNT OF WEAR OF EDGE RING, PLASMA PROCESSING APPARATUS, AND SUBSTRATE PROCESSING SYSTEM

(71) Applicant: Tokyo Electron Limited, Tokyo (JP)

(72) Inventors: Ikko Tanaka, Kurokawa-gun (JP); Atsushi Terasawa, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 112 days.

(21) Appl. No.: 18/598,613

(22) Filed: Mar. 7, 2024

(65) Prior Publication Data

US 2024/0212979 A1       Jun. 27, 2024

Related U.S. Application Data

(63) Continuation of application No. PCT/JP2023/003660, filed on Feb. 3, 2023.

(30) Foreign Application Priority Data

Feb. 15, 2022     (JP) ................................. 2022-021031

(51) Int. Cl.
| | |
|---|---|
| *H01J 37/302* | (2006.01) |
| *H01J 37/20* | (2006.01) |
| *H01J 37/32* | (2006.01) |
| *H01L 21/683* | (2006.01) |

(52) U.S. Cl.
CPC .......... *H01J 37/3023* (2013.01); *H01J 37/20* (2013.01); *H01J 37/32449* (2013.01); *H01L 21/6831* (2013.01)

(58) Field of Classification Search
None
See application file for complete search history.

(56) References Cited

U.S. PATENT DOCUMENTS

| | | | | |
|---|---|---|---|---|
| 2020/0335368 A1* | 10/2020 | Pan | ......................... | H01L 22/12 |
| 2021/0166920 A1* | 6/2021 | Koshimizu | ....... | H01L 21/67253 |
| 2021/0175110 A1 | 6/2021 | Sung et al. | | |

* cited by examiner

*Primary Examiner* — Kenneth B Wells

(74) *Attorney, Agent, or Firm* — Studebaker Brackett PLLC

(57) ABSTRACT

A method includes (a) generating plasma in a chamber in a plasma processing apparatus. The plasma processing apparatus includes a substrate support in the chamber. The substrate support includes a first portion to support a substrate and a second portion to support an edge ring. The first portion includes a first electrode, and the second portion includes a second electrode. The method further includes (b) cyclically applying, to draw ions from the plasma to the substrate support, a pulse of a voltage to the first electrode and the second electrode. The method further includes (c) determining an amount of wear of the edge ring based on a first voltage value of the first electrode and a second voltage value of the second electrode measured when the pulse of the voltage is applied to the first electrode and the second electrode.

20 Claims, 9 Drawing Sheets

METHOD FOR DETERMINING AMOUNT OF WEAR OF EDGE RING, PLASMA PROCESSING APPARATUS, AND SUBSTRATE PROCESSING SYSTEM

CROSS-REFERENCE TO RELATED APPLICATIONS

This application is a continuation application of PCT Application No. PCT/JP2023/003660, filed on Feb. 3, 2023, which claims the benefit of priority from Japanese Patent Application No. 2022-021031, filed on Feb. 15, 2022. The entire contents of the above listed PCT and priority applications are incorporated herein by reference.

BACKGROUND

Field

Exemplary embodiments of the disclosure relate to a method for determining the amount of wear of an edge ring, a plasma processing apparatus, and a substrate processing system.

Description of the Related Art

Plasma processing is used in manufacturing substrates using a plasma processing apparatus. The plasma processing apparatus includes a substrate support in the chamber. The substrate support supports a substrate placed on the substrate support. The substrate support may further support an edge ring. The substrate is placed in an area on the substrate support surrounded by the edge ring. The plasma processing apparatus may apply a voltage to the edge ring as described in U.S. Patent Application Publication No. 2021/0175110.

SUMMARY

A method for determining an amount of wear of an edge ring according to an exemplary embodiment includes (a) generating plasma in a chamber in a plasma processing apparatus. The plasma processing apparatus includes a substrate support in the chamber. The substrate support includes a first portion to support a substrate placed on the substrate support and a second portion to support the edge ring placed on the substrate support. The first portion includes a first electrode, and the second portion includes a second electrode. The method further includes (b) cyclically applying, to draw ions from the plasma to the substrate support, a pulse of a voltage to the first electrode and the second electrode during generation of the plasma in (a). The method further includes (c) determining the amount of wear of the edge ring based on a first voltage value of the first electrode and a second voltage value of the second electrode measured when the pulse is applied to the first electrode and the second electrode in (b).

DETAILED DESCRIPTION

Figure 1:
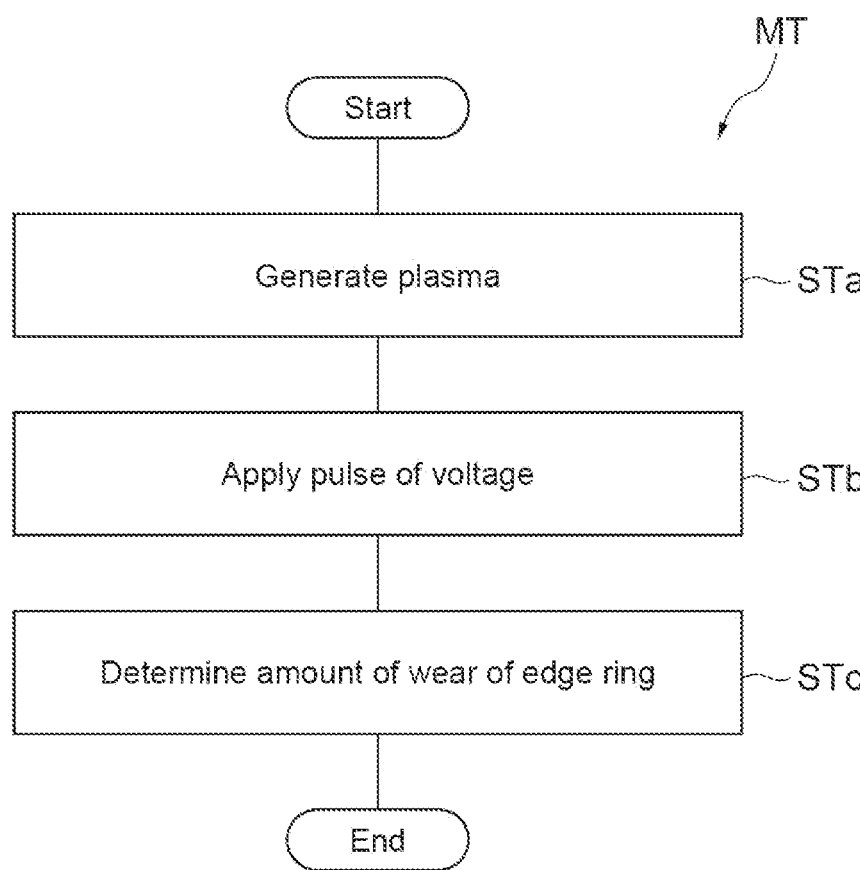
FIG. 1 is a flowchart of a method for determining the amount of wear of an edge ring according to one exemplary embodiment.

Exemplary embodiments will now be described in detail with reference to the drawings. In the figures, like reference numerals denote like or corresponding components.

FIG. 1 is a flowchart of a method for determining the amount of wear of an edge ring according to one exemplary embodiment. A plasma processing apparatus uses a method MT shown in FIG. 1 to determine the amount of wear of the edge ring.

Figure 2:
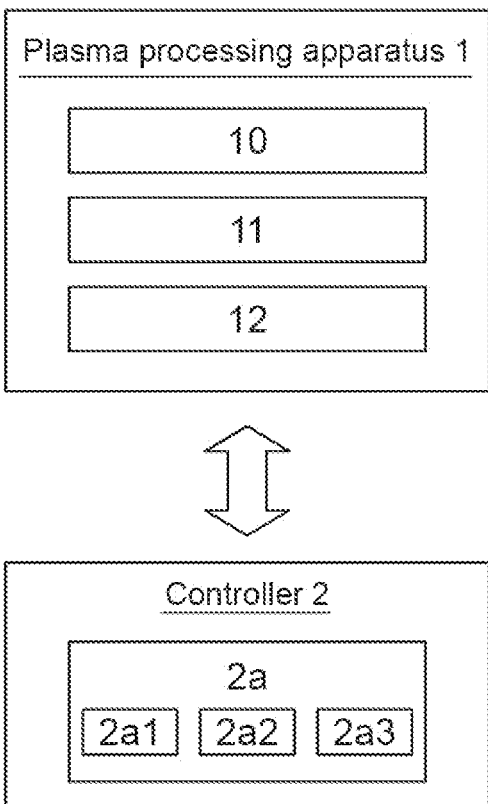
FIG. 2 is a diagram of a plasma processing system with an example structure.

FIG. 2 is a diagram of a plasma processing system with an example structure. In one embodiment, the plasma processing system includes a plasma processing apparatus 1 and a controller 2. The plasma processing system is an example of a substrate processing system. The plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. The plasma processing chamber 10 has at least one gas inlet for receiving at least one process gas supplied into the plasma processing space and at least one gas outlet for discharging the gas from the plasma processing space. The gas inlet is connected to a gas supply 20 (described later). The gas outlet is connected to an exhaust system 40 (described later). The substrate support 11 is located in the plasma processing space and has a substrate support surface for supporting a substrate.

The plasma generator 12 generates plasma from at least one process gas supplied into the plasma processing space. The plasma generated in the plasma processing space may be, for example, capacitively coupled plasma (CCP), inductively coupled plasma (ICP), electron cyclotron resonance (ECR) plasma, helicon wave plasma (HWP), or surface wave plasma (SWP).

The controller 2 processes computer-executable instructions that cause the plasma processing apparatus 1 to perform various steps described in one or more embodiments of the disclosure. The controller 2 may control the components of the plasma processing apparatus 1 to perform the various steps described herein. In one embodiment, some or all of the components of the controller 2 may be included in the plasma processing apparatus 1. The controller 2 may include a processor 2a1, a storage 2a2, and a communication interface 2a3. The controller 2 is implemented by, for example, a computer 2a. The processor 2a1 may perform various control operations by loading a program from the storage 2a2 and executing the loaded program. The program may be prestored in the storage 2a2 or may be obtained through a medium as appropriate. The obtained program is stored into the storage 2a2 to be loaded from the storage 2a2 and executed by the processor 2a1. The medium may be one of various storage media readable by the computer 2*a*, or a communication line connected to the communication interface 2*a*3. The processor 2*a*1 may be a central processing unit (CPU). The storage 2*a*2 may include a random-access memory (RAM), a read-only memory (ROM), a hard disk drive (HDD), a solid-state drive (SSD), or a combination of these. The communication interface 2*a*3 may communicate with the plasma processing apparatus 1 through a communication line such as a local area network (LAN).

Figure 3:
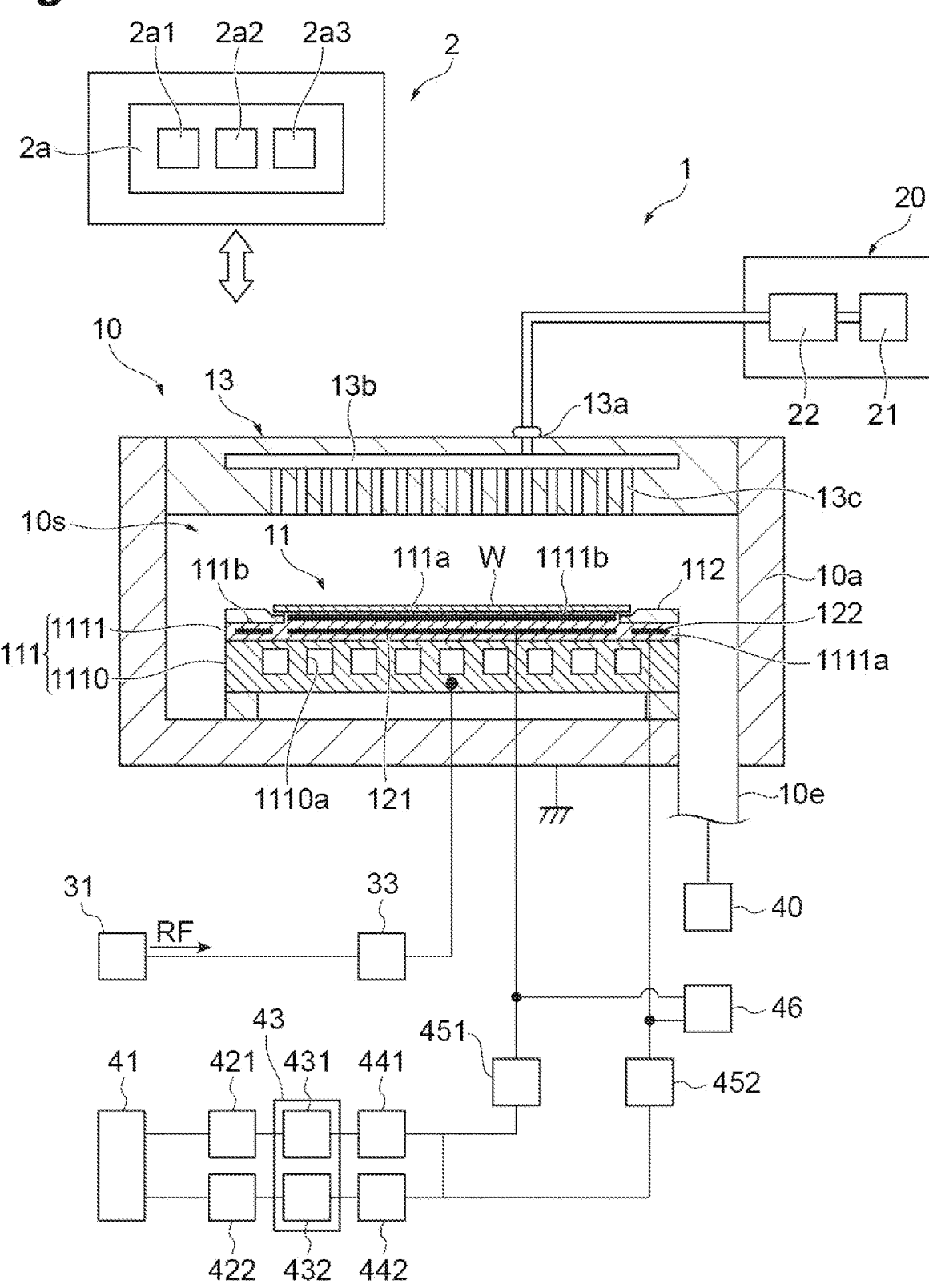
FIG. 3 is a diagram of a capacitively coupled plasma processing apparatus with an example structure.

An example structure of a capacitively coupled plasma processing apparatus as an example of the plasma processing apparatus 1 will now be described. FIG. 3 is a diagram of the capacitively coupled plasma processing apparatus with the structure.

The capacitively coupled plasma processing apparatus 1 includes a plasma processing chamber 10, a gas supply 20, and an exhaust system 40. The plasma processing apparatus 1 also includes the substrate support 11 and a gas inlet unit. The gas inlet unit allows at least one process gas to be introduced into the plasma processing chamber 10. The gas inlet unit includes a shower head 13. The substrate support 11 is located in the plasma processing chamber 10. The shower head 13 is located above the substrate support 11. In one embodiment, the shower head 13 defines at least a part of the ceiling of the plasma processing chamber 10. The plasma processing chamber 10 has a plasma processing space 10*s* defined by the shower head 13, a side wall 10*a* of the plasma processing chamber 10, and the substrate support 11. The plasma processing chamber 10 is grounded. The shower head 13 and the substrate support 11 are electrically insulated from the housing of the plasma processing chamber 10.

The substrate support 11 includes a body 111 and an edge ring 112. The body 111 includes a first portion 111*a* (central portion) for supporting a substrate W and a second portion 111*b* (annular portion) for supporting the edge ring 112. The substrate W is, for example, a wafer. The second portion 111*b* of the body 111 surrounds the first portion 111*a* of the body 111 in a plan view. The substrate W is located on the first portion 111*a* of the body 111. The edge ring 112 is located on the second portion 111*b* of the body 111 to surround the substrate W located on the first portion 111*a* of the body 111.

In one embodiment, the body 111 includes a base 1110 and an electrostatic chuck (ESC) 1111. The base 1110 includes a conductive member. The ESC 1111 is located on the base 1110. The ESC 1111 includes a ceramic member 1111*a* and an electrostatic electrode 1111*b* inside the ceramic member 1111*a*. The ceramic member 1111*a* defines the first portion 111*a*. In one embodiment, the ceramic member 1111*a* further defines the second portion 111*b*. The second portion 111*b* may include another member surrounding the ESC 1111, such as an annular ESC or an annular insulating member. In this case, the edge ring 112 may be located on either the annular ESC or the annular insulating member, or may be located on both the ESC 1111 and the annular insulating member.

The edge ring 112 includes one or more annular members. The edge ring 112 is formed from a conductive material or an insulating material.

The substrate support 11 may also include a temperature control module that adjusts the temperature of at least one of the ESC 1111, the edge ring 112, or the substrate to a target temperature. The temperature control module may include a heater, a heat transfer medium, a channel 1110*a*, or a combination of these. The channel 1110*a* allows a flow of heat transfer fluid such as brine or gas through it. In one embodiment, the channel 1110*a* is defined in the base 1110, and one or more heaters are located in the ceramic member 1111*a* in the ESC 1111. The substrate support 11 may include a heat transfer gas supply to supply a heat transfer gas into a space between the back surface of the substrate W and the first portion 111*a*.

The shower head 13 introduces at least one process gas from the gas supply 20 into the plasma processing space 10*s*. The shower head 13 has at least one gas inlet 13*a*, at least one gas-diffusion compartment 13*b*, and multiple gas guides 13*c*. The process gas supplied to the gas inlet 13*a* passes through the gas-diffusion compartment 13*b* and is introduced into the plasma processing space 10*s* through the multiple gas guides 13*c*. The shower head 13 also includes at least one upper electrode. In addition to the shower head 13, the gas inlet unit may include one or more side gas injectors (SGIs) installed in one or more openings in the side wall 10*a*.

The gas supply 20 may include at least one gas source 21 and at least one flow controller 22. In one embodiment, the gas supply 20 allows supply of at least one process gas from the corresponding gas source 21 to the shower head 13 through the corresponding flow controller 22. The flow controller 22 may include, for example, a mass flow controller or a pressure-based flow controller. The gas supply 20 may further include at least one flow rate modulator that allows supply of at least one process gas at a modulated flow rate or in a pulsed manner.

The exhaust system 40 is connectable to, for example, a gas outlet 10*e* in the bottom of the plasma processing chamber 10. The exhaust system 40 may include a pressure control valve and a vacuum pump. The pressure control valve regulates the pressure in the plasma processing space 10*s*. The vacuum pump may include a turbomolecular pump, a dry pump, or a combination of these.

The first portion 111*a* described above includes a first electrode 121. The first electrode 121 may be located in the ceramic member 1111*a* in the ESC 1111. The first electrode 121 may be a film of a conductive material. The first electrode 121 may have a circular planar shape. The second portion 111*b* includes a second electrode 122. The second electrode 122 may be located in the ceramic member 1111*a* in the ESC 1111. The second electrode 122 may be a film of a conductive material. The second electrode 122 may have a substantially annular planar shape.

The plasma processing apparatus 1 further includes a radio-frequency (RF) power supply 31. The RF power supply 31 serves as the plasma generator 12 in one embodiment. The RF power supply 31 generates source radio-frequency power RF. The source radio-frequency power RF has a source frequency $f_{RF}$. The source frequency $f_{RF}$ may be within a range of 10 to 150 MHz. The RF power supply 31 is electrically coupled to an RF electrode through a matcher 33 to provide the source radio-frequency power RF to the RF electrode. The RF electrode may be the conductive member in the base 1110, may be at least one electrode in the ceramic member 1111*a*, or may be the upper electrode. In response to the source radio-frequency power RF provided to the RF electrode, plasma is generated from the gas in the chamber 10.

The matcher 33 has a variable impedance that is set to reduce reflection of the source radio-frequency power RF from a load. The matcher 33 may be controlled by, for example, the controller 2.

Figure 4:
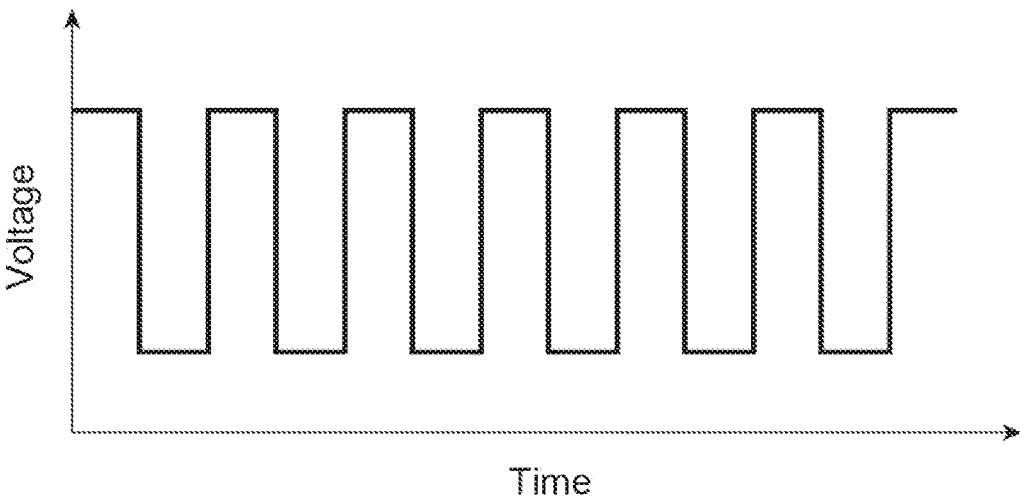
FIG. 4 is a diagram of an example pulse of a voltage.

The plasma processing apparatus 1 further includes a pulse generator 43. The pulse generator 43 cyclically applies a pulse of a voltage having a waveform cycle to the first electrode 121 and the second electrode 122. The frequency being the inverse of the duration of the waveform cycle may fall within a range of 100 kHz to 60 MHz. The pulse of the voltage may be a pulse of a negative voltage or a pulse of a negative direct current (DC) voltage. FIG. 4 is a diagram of an example pulse of the voltage. As shown in FIG. 4, the pulse of the voltage may be a square wave pulse. The pulse of the voltage may include any waveform, such as a triangular pulse.

In one embodiment, the plasma processing apparatus 1 may further include a DC power supply 41, smoothing circuits 421 and 422, damping circuits 441 and 442, and filters 451 and 452. The pulse generator 43 may include switching circuits 431 and 432. The switching circuits 431 and 432 include switching elements. The switching elements may be open or closed as controlled by the controller 2.

The DC power supply 41 includes two outputs. One output of the DC power supply 41 is coupled to the first electrode 121 through the smoothing circuit 421, the switching circuit 431, the damping circuit 441, and the filter 451. The switching circuit 431 is open and closed to generate a pulse of the voltage from the DC voltage from one output of the DC power supply 41, and applies the pulse of the voltage to the first electrode 121. A part of the pulse of the voltage from the switching circuit 431 may be branched and applied to the second electrode 122. The filter 451 blocks or reduces RF power.

The other output of the DC power supply 42 is coupled to the second electrode 122 through the smoothing circuit 422, the switching circuit 432, the damping circuit 442, and the filter 452. The switching circuit 432 is open and closed to generate a pulse of the voltage from the DC voltage from the other output of the DC power supply 41, and applies the pulse of the voltage to the second electrode 122. The filter 452 blocks or reduces RF power.

As shown in FIG. 3, the plasma processing apparatus 1 further includes a sensor 46. The sensor 46 measures a first voltage value $V_1$ of the first electrode 121 and a second voltage value $V_2$ of the second electrode 122.

Referring back to FIG. 1, the method MT will now be described in detail. The plasma processing apparatus 1 using the method MT will be described below. However, the method MT may be used by a plasma processing apparatus other than the plasma processing apparatus 1.

As shown in FIG. 1, the method MT includes steps STa to STc. In one embodiment, steps STa and STb are performed for plasma processing on the substrate W in the chamber 10. In steps STa and STb, multiple substrates W may be processed sequentially. More specifically, multiple substrates W are placed into the chamber 10 sequentially and processed with plasma in steps STa and STb. The substrates W may be loaded into the chamber 10 in the process module, which is the plasma processing apparatus 1, in a substrate processing system PS (described later), and processed.

In step STa, plasma is generated in the chamber 10. In step STa, the controller 2 controls the gas supply 20 to supply a gas into the chamber 10. In step STa, the controller 2 controls the exhaust system 40 to maintain the chamber 10 at a specified pressure. In step STa, the controller 2 controls the plasma generator 12 to generate plasma from the gas in the chamber 10. In one embodiment, the controller 2 controls the RF power supply 31 to provide the source radio-frequency power RF to the RF electrode.

Step STb is performed during generation of plasma in step STa. In step STb, a pulse of a voltage is cyclically applied to the first electrode 121 and the second electrode 122 to draw ions from the plasma to the substrate support 11. In step STb, the controller 2 controls the pulse generator 43 to cyclically apply a pulse of the voltage to the first electrode 121 and the second electrode 122.

In step STc, the amount of wear of the edge ring 112 is determined. The amount of wear of the edge ring 112 is determined based on the first voltage value $V_1$ and the second voltage value $V_2$ obtained by the sensor 46 when the pulse is applied to the first electrode 121 and the second electrode 122 in step STb.

Figure 5:
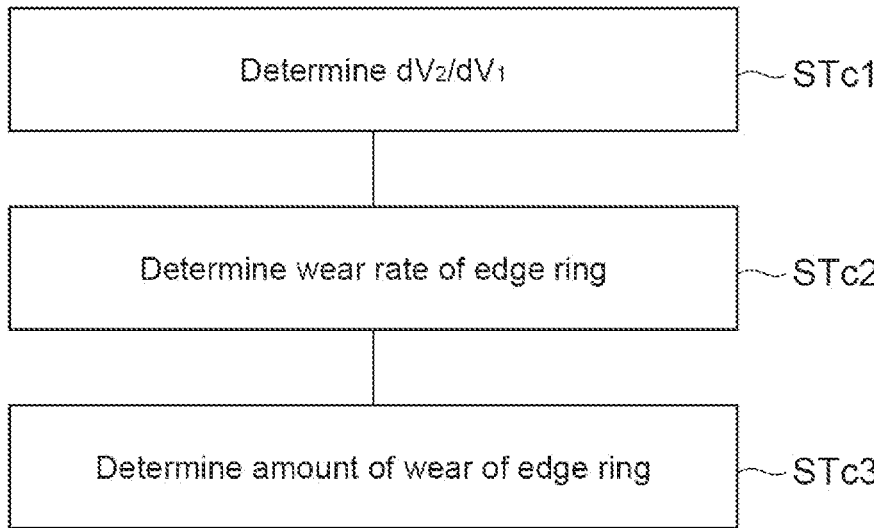
FIG. 5 is a flowchart of step STc included in the method shown in FIG. 1 according to one embodiment.

FIG. 5 is a flowchart of step STc included in the method shown in FIG. 1 according to one embodiment. In one embodiment, step STc includes steps STc1 to STc3 as shown in FIG. 5. In step STc1, the ratio $(dV_2/dV_1)$ of a time change $dV_2$ of the second voltage value $V_2$ to a time change $dV_1$ of the first voltage value $V_1$ is determined. The ratio $(dV_2/dV_1)$ may be determined by the controller 2. The time change $dV_1$ is determined based on the time series of the first voltage value $V_1$ obtained while step STb is being performed. The time change $dV_2$ is determined based on the time series of the second voltage value $V_2$ obtained while step STb is being performed.

Figure 6:
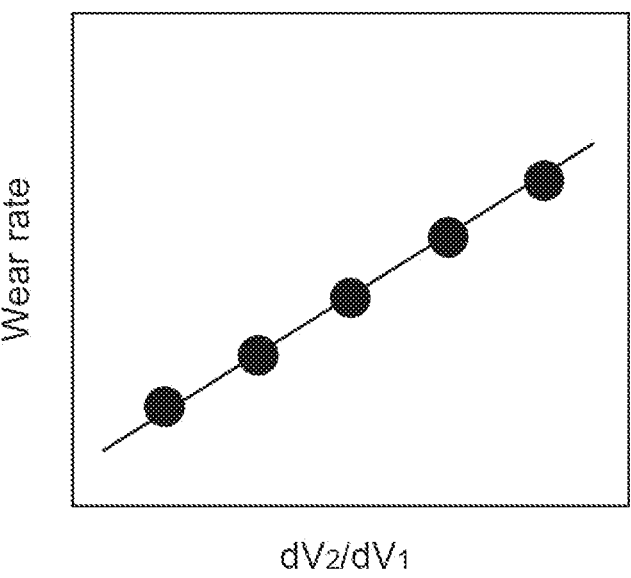
FIG. 6 is a graph showing an example relationship between the ratio of a time change of a second voltage value to a time change of a first voltage value and the wear rate of the edge ring.

In step STc2, the wear rate of the edge ring 112 corresponding to the ratio $(dV_2/dV_1)$ is determined using a predefined relationship between the magnitude of the ratio $(dV_2/dV_1)$ and the wear rate of the edge ring 112. The wear rate of the edge ring 112 is the rate at which the thickness of the edge ring 112 decreases and may be determined by the controller 2. FIG. 6 is a graph showing an example relationship between the ratio of the time change of the second voltage value to the time change of the first voltage value and the wear rate of the edge ring. As shown in FIG. 6, the ratio $(dV_2/dV_1)$ and the wear rate of the edge ring 112 have a correlation between them. The controller 2 has, as a function, the correlation between the ratio $(dV_2/dV_1)$ and the wear rate of the edge ring 112. The controller 2 uses this function to determine the wear rate of the edge ring 112 corresponding to the ratio $(dV_2/dV_1)$.

In step STc3, the product of the wear rate of the edge ring 112 and the duration for which the edge ring 112 is exposed to plasma is determined to be the amount of wear of the edge ring 112, or in other words, a decrease in the thickness of the edge ring 112. The amount of wear of the edge ring 112 may be determined by the controller 2.

In the plasma processing apparatus 1, the impedance of the substrate W remains substantially unchanged over time, but the impedance of the edge ring 112 changes over time as the edge ring 112 wears. Thus, the second voltage value $V_2$ changes over time with respect to the first voltage value $V_1$. Thus, the relative relationship between the first voltage value $V_1$ and the second voltage value $V_2$ reflects the amount of wear of the edge ring 112. The method MT allows determination of the amount of wear of the edge ring 112 based on the first voltage value $V_1$ and the second voltage value $V_2$.

Figure 7:
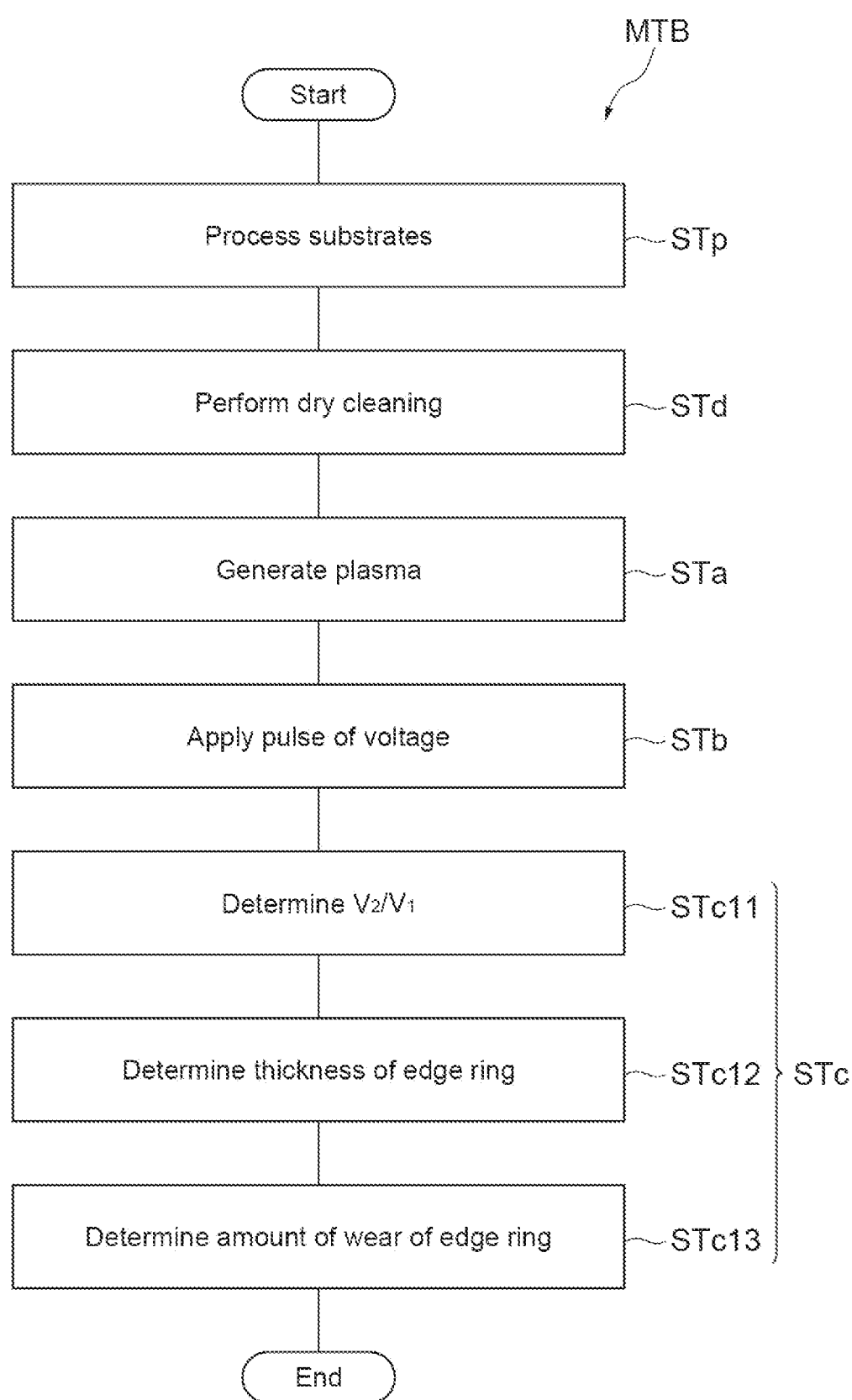
FIG. 7 is a flowchart of a method for determining the amount of wear of the edge ring according to another exemplary embodiment.

A method for determining the amount of wear of an edge ring according to another exemplary embodiment will now be described with reference to FIG. 7. FIG. 7 is a flowchart of the method for determining the amount of wear of the edge ring according to the other exemplary embodiment. The plasma processing apparatus 1 with a method MTB shown in FIG. 7 will be described below. However, the method MTB may be used by a different plasma processing apparatus other than the plasma processing apparatus 1.

The method MTB includes steps STa to STc, similarly to the method MT. The method MTB may further include steps STp and STd. Steps STa to STc may be performed immediately after step STd.

In step STp, plasma processing on the substrate W is performed in the chamber 10. In step STp, the plasma processing may be performed sequentially on multiple substrates W. More specifically, multiple substrates W are placed into the chamber 10 sequentially and processed with plasma in steps STa and STb. The substrates W may be loaded into the chamber 10 in the process module, which is the plasma processing apparatus 1, in the substrate processing system PS (described later), and processed.

In step STp, the controller 2 controls the gas supply 20 to supply a gas into the chamber 10. In step STp, the controller 2 controls the exhaust system 40 to maintain the chamber 10 at a specified pressure. In step STp, the controller 2 controls the plasma generator 12 to generate plasma from the gas in the chamber 10. In one embodiment, the controller 2 controls the RF power supply 31 to provide the source radio-frequency power RF to the RF electrode. In step STp, the controller 2 may control the pulse generator 43 to cyclically apply a pulse of the voltage to the first electrode 121 and the second electrode 122 to draw ions from the plasma to the substrate support 11.

In the subsequent step STd, the chamber 10 is dry cleaned. In step STd, the controller 2 controls the gas supply 20 to supply a cleaning gas into the chamber 10. In step STd, the controller 2 controls the exhaust system 40 to maintain the chamber 10 at a specified pressure. In step STd, the controller 2 controls the plasma generator 12 to generate plasma from the cleaning gas in the chamber 10. In one embodiment, the controller 2 controls the RF power supply 31 to provide the source radio-frequency power RF to the RF electrode.

Steps STa and STb included in the method MTB are performed to measure the first voltage value $V_1$ and the second voltage value $V_2$ used in step STc11 described below. Steps STa and STb may be performed with the substrate W placed in the chamber 10.

Step STc in the method MTB includes steps STc11 to STc13. In step STc11, the ratio $(V_2/V_1)$ of the second voltage value $V_2$ to the first voltage value $V_1$ is determined. The first voltage value $V_1$ and the second voltage value $V_2$ are measured with the sensor 46 when the pulse of the voltage is applied to the first electrode 121 and the second electrode 122 in step STb. The ratio $(V_2/V_1)$ may be determined by the controller 2.

Figure 8:
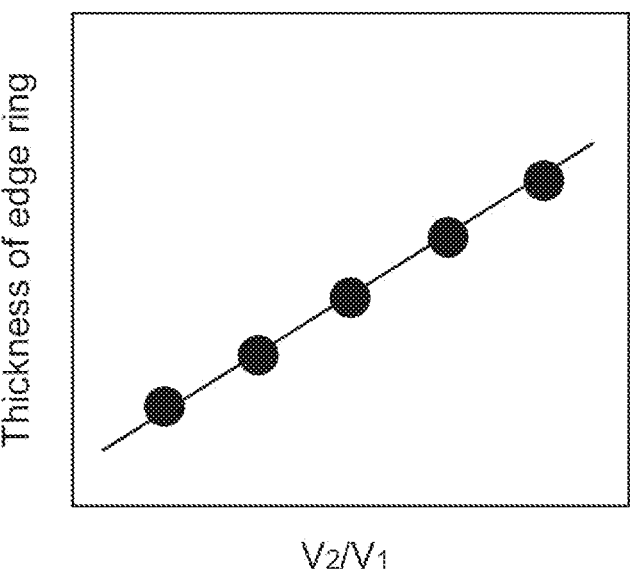
FIG. 8 is a graph showing an example relationship between the ratio of a second voltage value to a first voltage value and the thickness of the edge ring.

In step STc12, the thickness of the edge ring 112 corresponding to the ratio $(V_2/V_1)$ is determined using a predefined relationship between the magnitude of the ratio $(V_2/V_1)$ and the thickness of the edge ring 112. The thickness of the edge ring 112 may be determined by the controller 2. FIG. 8 is a graph showing an example relationship between the ratio of the second voltage value to the first voltage value and the thickness of the edge ring. As shown in FIG. 8, the ratio $(V_2/V_1)$ and the thickness of the edge ring 112 have a correlation between them. The controller 2 has, as a function, the correlation between the ratio $(V_2/V_1)$ and the thickness of the edge ring 112. The controller 2 uses this function to determine the thickness of the edge ring 112 corresponding to the ratio $(V_2/V_1)$.

In step STc13, the amount of wear of the edge ring 112 is determined. The amount of wear of the edge ring 112 may be determined by the controller 2. The amount of wear of the edge ring 112 is determined by subtracting the thickness of the edge ring 112 determined in step STc12 from the initial value of the thickness of the edge ring 112.

As described above, the method MTB also allows determination of the amount of wear of the edge ring 112 based on the first voltage value $V_1$ and the second voltage value $V_2$. In step STp, the deposit on the edge ring 112 is removed in step STd. Thus, the second voltage value $V_2$ can be measured without being affected by the deposit on the edge ring 112 in step STp.

Several processes that can be added to the method MT and the method MTB (hereafter, each of the method MT and the method MTB may also be referred to as the method M) will now be described.

Voltage Application Process

In one embodiment, the method M may further include a voltage application process. The voltage application process includes applying, in response to the amount of wear of the edge ring 112 obtained in the step STc being greater than the first threshold value, a voltage from a power supply to the edge ring 112 to correct the thickness of a sheath (plasma sheath) above the edge ring 112. The power supply may be a DC power supply coupled to the edge ring 112 and be controlled by the controller 2 in the voltage application process. The voltage application process is performed during generation of plasma in the chamber 10 with the substrate W placed on the substrate support 11. The voltage application process may be performed during generation of plasma in step STa.

The upper end of the sheath (plasma sheath) above the edge ring 112 is at a lower position as the edge ring 112 wears. The level of the voltage applied to the edge ring 112 in the voltage application process is predetermined as the level corresponding to the amount of wear of the edge ring 112 to reduce or eliminate the difference between the position of the upper end of the sheath above the edge ring 112 and the position of the upper end of the sheath above the substrate W.

Parameter Changing Process

In one embodiment, the method M may further include a parameter changing process. The parameter changing process includes changing at least one parameter in response to the amount of wear of the edge ring 112 obtained in step STc being greater than the first threshold value. The voltage application process is performed during generation of plasma in the chamber 10 with the substrate W placed on the substrate support 11. The parameter changing process may be performed during generation of plasma in step STa.

At least one parameter to be changed in the parameter changing process is selected from the group consisting of the power level of the source radio-frequency power RF, the voltage level of the pulse of a DC voltage applied to the first electrode 121 described above, the voltage level of the pulse of the DC voltage applied to the second electrode 122 described above, the flow rate of the gas supplied from the gas supply 20 into the chamber 10, the pressure in the chamber 10, the pressure of the heat transfer gas supplied from the heat transfer gas supply to the gap between the substrate support 11 and the back surface of the substrate W, and the in-plane temperature distribution at the substrate support 11. In the parameter changing process, the controller 2 controls at least one of the RF power supply 31, the gas supply 20, the exhaust system 40, the heat transfer gas supply, or the temperature control module described above.

Notification Process

In one embodiment, the method M may further include a notification process. In the notification process, the controller 2 provides a notification of a time to replace the edge ring 112 in response to the amount of wear of the edge ring 112 obtained in step STc being greater than a second threshold. The controller 2 may provide a notification as an audible sound from a speaker, or instead of or in addition to this, display the notification on a display. The second threshold is greater than the first threshold described above.

Cleaning Process

In one embodiment, the method M may further include a cleaning process. The cleaning process includes cleaning, in response to the amount of wear of the edge ring 112 obtained in step STc being greater than the second threshold value described above, the chamber 10 with loading of the substrate into the chamber 10 being stopped. In the cleaning process, the controller 2 controls the gas supply 20 to supply a cleaning gas into the chamber 10. The cleaning process may be performed with a dummy substrate placed on the first portion 111a or with no object placed on the first portion 111a. The cleaning process in the chamber 10 may be similar to dry cleaning in step STd.

Edge Ring Replacement Process

In one embodiment, the method M may further include an edge ring replacement process. The method M including the edge ring replacement process is performed in the substrate processing system PS.

Figure 9:
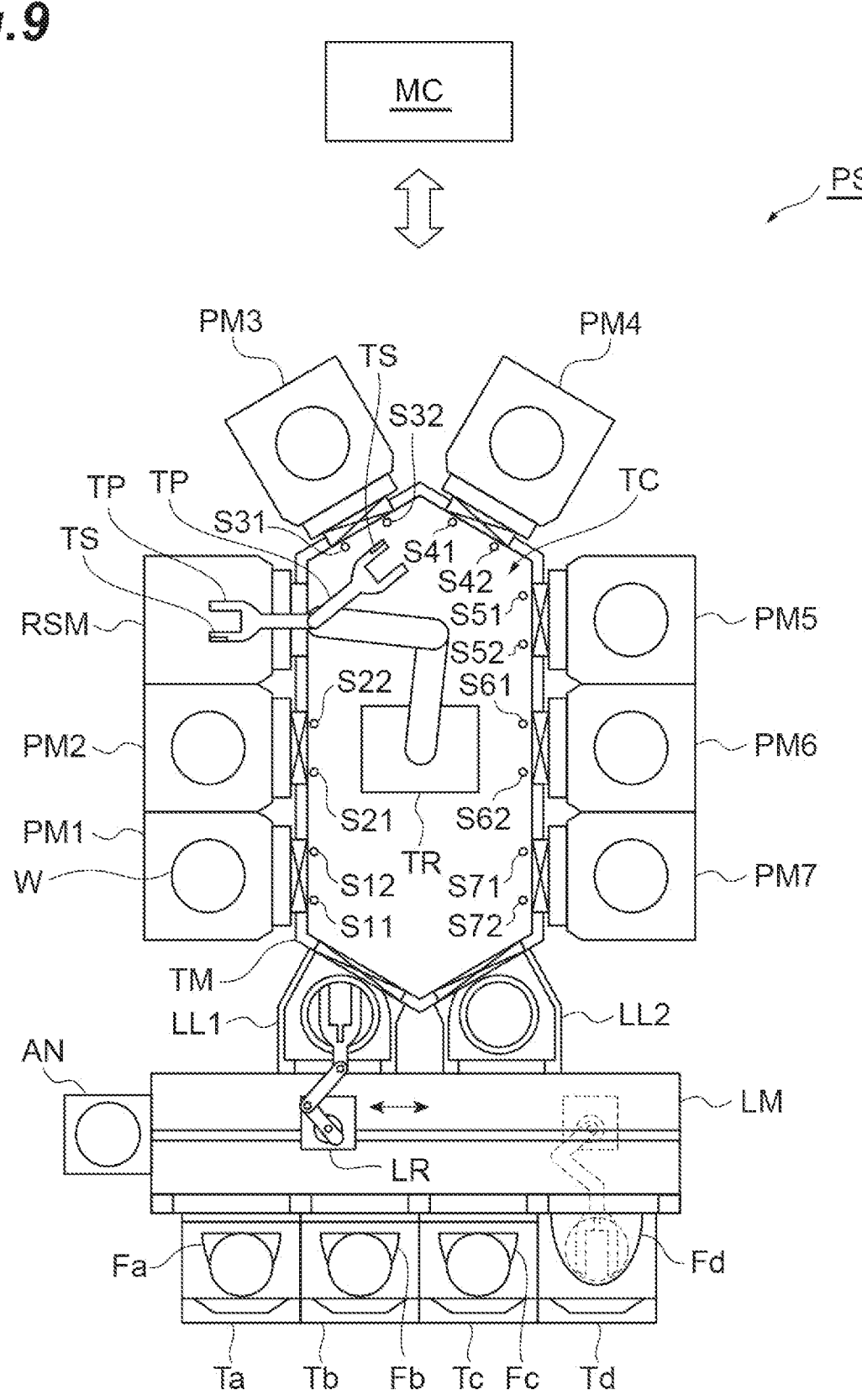
FIG. 9 is a diagram of a substrate processing system according to one exemplary embodiment.

FIG. 9 is a diagram of a substrate processing system according to one exemplary embodiment. The substrate processing system PS shown in FIG. 9 includes a transfer module TM (vacuum transfer module), multiple process modules PM1 to PM7, and a controller MC. The substrate processing system PS may further include tables Ta to Td, containers Fa to Fd, a loader module LM, an aligner AN, a loadlock module LL1, a loadlock module LL2, and a stocker module RSM. The substrate processing system PS may include one or more tables, containers, and loadlock modules. The substrate processing system PS may include two or more process modules.

The tables Ta to Td are arranged along one edge of the loader module LM. The containers Fa to Fd are mounted on the respective tables Ta to Td. The containers Fa to Fd each are, for example, a front-opening unified pod (FOUP). The containers Fa to Fd each store substrates W.

The loader module LM includes a transfer chamber. The transfer chamber in the loader module LM has an atmospheric pressure. The loader module LM includes a transfer robot LR. The controller MC controls the transfer robot LR. The transfer robot LR transfers a substrate W through the transfer chamber in the loader module LM. The transfer robot LR may transfer the substrate W between the containers Fa to Fd and the aligner AN, between the aligner AN and the loadlock modules LL1 and LL2, and between the loadlock modules LL1 and LL2 and the containers Fa to Fd. The aligner AN is connected to the loader module LM. The aligner AN adjusts (aligns) the position of the substrate W.

The loadlock module LL1 and the loadlock module LL2 are connected between the transfer chamber in the loader module LM and a transfer chamber TC in the transfer module TM. The loadlock module LL1 and the loadlock module LL2 serve as preliminary decompression chambers. A gate valve is located between the preliminary decompression chamber in each of the loadlock module LL1 and the loadlock module LL2 and the transfer chamber in the loader module LM. A gate valve is located between the preliminary decompression chamber in each of the loadlock module LL1 and the loadlock module LL2 and the transfer chamber TC in the transfer module TM.

The transfer module TM includes the transfer chamber TC and a transfer robot TR. The transfer chamber TC has an internal space that can be decompressed. The transfer robot TR includes picks TP. The transfer robot TR may include at least two picks TP. In the illustrated example, the transfer robot TR includes two picks TP. One pick TP is located above the other pick TP. The transfer robot TR transfers the substrate W on one of the two picks TP through the transfer chamber TC. The controller MC controls the transfer robot TR.

The transfer module TM may include position detection sensors S11 and S12. The position detection sensors S11 and S12 are installed on the transfer path for the substrate W and the edge ring from the transfer module TM to the process module PM1. The position detection sensors S11 and S12 are used to correct the positions of the substrate W and the edge ring that are transferred from the transfer module TM to the process module PM1. The position detection sensors S11 and S12 are located, for example, adjacent to the gate valve that separates the transfer module TM and the process module PM1. The position detection sensors S11 and S12 are located, for example, at a distance from each other being smaller than the outer diameter of the substrate W and smaller than the inner diameter of the edge ring. The transfer module TM may include position detection sensors S21, S22, S31, S32, S41, S42, S51, S52, S61, S62, S71, and S72, similarly to the position detection sensors S11 and S12. The position detection sensors S21 and S22 are installed on the transfer path for the substrate W and the edge ring from the transfer module TM to the process module PM2. The position detection sensors S31 and S32 are installed on the transfer path for the substrate W and the edge ring from the transfer module TM to the process module PM3. The position detection sensors S41 and S42 are installed on the transfer path for the substrate W and the edge ring from the transfer module TM to the process module PM4. The position detection sensors S51 and S52 are installed on the transfer path for the substrate W and the edge ring from the transfer module TM to the process module PM5. The position detection sensors S61 and S62 are installed on the transfer path for the substrate W and the edge ring from the transfer module TM to the process module PM6. The position detection sensors S71 and S72 are installed on the transfer path for the substrate W and the edge ring from the transfer module TM to the process module PM7.

In one embodiment, the transfer robot TR transfers an edge ring for a substrate support in one of the process modules PM1 to PM7. The edge ring is placed on either of the two picks TP and is transferred. An edge ring used in the process module may be transferred using the lower one of the two picks TP. An edge ring to replace a used edge ring may be transferred using the upper one of the two picks TP.

Each pick TP includes a sensor TS. The sensor TS is an optical sensor and measures the position of the edge ring on the substrate support.

Each of the process modules PM1 to PM7 is designed for its dedicated substrate processing and includes a processing chamber. A gate valve is located between each processing chamber and the transfer chamber TC. At least one of the process modules PM1 to PM7 is the plasma processing apparatus 1.

The stocker module RSM is connected to the transfer chamber TC with a gate valve. The stocker module RSM includes a chamber. The chamber in the stocker module RSM has its internal space that can be decompressed. The chamber in the stocker module RSM includes a first space and a second space. The first space may be located below the second space. The first space is to contain a cassette. The cassette can store (or contain) edge rings.

The second space contains an aligner. The aligner includes a rotary stage and an optical sensor. The aligner can detect and adjust the position of an edge ring on the rotary stage using the rotary stage and the optical sensor.

The controller MC controls the components of the substrate processing system PS. The controller MC may be a computer including a processor, a storage, an input device, and a display. The controller MC executes a control program stored in the storage to control the components of the substrate processing system PS based on recipe data stored in the storage. The controller MC may be the controller 2. The controller MC may be a controller different from the controller 2. The controller MC may control the components of the substrate processing system PS in cooperation with the controller 2.

The edge ring replacement process is performed in response to the amount of wear of the edge ring 112 obtained in step STc being greater than the second threshold described above. The edge ring replacement process is performed with loading of the substrate into the chamber 10 being stopped. In the edge ring replacement process, the controller MC unloads the edge ring 112 from the chamber 10 by the transfer robot TR with the space in the chamber 10 (plasma processing space) remaining decompressed to replace the edge ring 112 in the chamber 10. In the edge ring replacement process, the controller MC controls the transfer module TM and the transfer robot TR.

Although the exemplary embodiments have been described above, the embodiments are not restrictive, and various additions, omissions, substitutions, and changes may be made. The components in the different embodiments may be combined to form another embodiment.

For example, the plasma processing apparatus 1 may include two DC power supplies in place of the DC power supply 41 with two outputs.

Various exemplary embodiments of the disclosure will be described in E1 to E20 below.

[E1]

A method for determining an amount of wear of an edge ring, the method comprising:

(a) generating plasma in a chamber in a plasma processing apparatus, the plasma processing apparatus including a substrate support in the chamber, the substrate support including a first portion to support a substrate placed on the substrate support and a second portion to support the edge ring placed on the substrate support, the first portion including a first electrode, the second portion including a second electrode;

(b) cyclically applying, to draw ions from the plasma to the substrate support, a pulse of a direct current voltage to the first electrode and the second electrode during generation of the plasma in (a); and (c) determining the amount of wear of the edge ring based on a first voltage value of the first electrode and a second voltage value of the second electrode measured when the pulse is applied to the first electrode and the second electrode in (b).

The impedance of the substrate remains substantially unchanged over time, but the impedance of the edge ring changes over time as the edge ring wears. Thus, the second voltage value changes over time with respect to the first voltage value. Thus, the relative relationship between the first voltage value and the second voltage value reflects the amount of wear of the edge ring. The method according to the above embodiment allows determination of the amount of wear of the edge ring based on the first voltage value of the first electrode and the second voltage value of the second electrode.

[E2]

The method according to E1, wherein (c) includes determining a ratio of a time change of the second voltage value to a time change of the first voltage value, determining, using a predefined relationship between a magnitude of the ratio and a wear rate of the edge ring, the wear rate of the edge ring corresponding to the determined ratio, and determining the amount of wear of the edge ring by determining a product of the determined wear rate of the edge ring and a duration for which the edge ring is exposed to the plasma.

[E3]

The method according to E1, wherein (c) includes determining a ratio of the second voltage value to the first voltage value, and determining, using a predefined relationship between a magnitude of the ratio and a thickness of the edge ring, the thickness of the edge ring corresponding to the determined ratio.

[E4]

The method according to E3, further comprising:

processing the substrate placed on the substrate support with plasma generated from a process gas in the chamber; and dry cleaning the chamber after the processing the substrate, wherein (a), (b), and (c) are performed immediately after the dry cleaning.

[E5]

The method according to any one of E1 to E4, wherein the pulse of the direct current voltage is a pulse of a negative direct current voltage.

[E6]

The method according to any one of E1 to E5, further comprising:

applying, in response to the amount of wear being greater than a first threshold, a voltage to the edge ring to correct a thickness of a sheath above the edge ring during generation of the plasma in the chamber with the substrate placed on the substrate support.

[E6]

The method according to any one of E1 to E5, further comprising:

changing, in response to the amount of wear being greater than a first threshold, at least one parameter during generation of the plasma in the chamber with the substrate placed on the substrate support, the at least one parameter being selected from the group consisting of a power level of radio-frequency power for generating the plasma, a voltage level of the pulse of the direct current voltage applied to the first electrode, a voltage level of the pulse of the direct current voltage applied to the second electrode, a flow rate of a gas supplied into the chamber, a pressure in the chamber, a pressure of a heat transfer gas supplied to a gap between the substrate support and the substrate, and an in-plane temperature distribution at the substrate support.

[E8]

The method according to E6 or E7, further comprising: providing a notification of a time to replace the edge ring in response to the amount of wear being greater than a second threshold, the second threshold being greater than the first threshold.

[E9]

The method according to E6 or E7, further comprising: cleaning, in response to the amount of wear being greater than a second threshold greater than the first threshold, the chamber with loading of the substrate into the chamber being stopped.

[E10]

The method according to E6 or E7, further comprising: replacing, in response to the amount of wear being greater than a second threshold greater than the first threshold, the edge ring with loading of the substrate into the chamber being stopped, wherein the edge ring is unloaded from the chamber by a transfer robot located in a vacuum transfer module connected to the chamber with a space in the chamber remaining decompressed.

[E11]

A plasma processing apparatus, comprising:
a chamber;
a substrate support in the chamber, the substrate support including a first portion to support a substrate placed on the substrate support and a second portion to support an edge ring placed on the substrate support, the first portion including a first electrode, the second portion including a second electrode;
a gas supply configured to supply a gas into the chamber;
a plasma generator configured to generate plasma from the gas in the chamber;
a pulse generator configured to cyclically apply a pulse of a direct current voltage to the first electrode and the second electrode;
a sensor configured to measure a voltage value of the first electrode and a voltage value of the second electrode; and
a controller configured to
(a) control the gas supply and the plasma generator to generate plasma in the chamber,
(b) control the pulse generator to cyclically apply, during generation of the plasma in (a), the pulse of the direct current voltage to the first electrode and the second electrode to draw ions from the plasma to the substrate support, and
(c) determine an amount of wear of the edge ring based on a first voltage value of the first electrode and a second voltage value of the second electrode measured when the pulse is applied to the first electrode and the second electrode in (b).

[E12]

The plasma processing apparatus according to E11, wherein
the controller is configured to:
determine a ratio of a time change of the second voltage value to a time change of the first voltage value,
determine, using a predefined relationship between a magnitude of the ratio and a wear rate of the edge ring, the wear rate of the edge ring corresponding to the determined ratio, and determine the amount of wear of the edge ring by determining a product of the determined wear rate of the edge ring and a duration for which the edge ring is exposed to the plasma.

[E13]

The plasma processing apparatus according to E11, wherein
the controller is configured to
determine a ratio of the second voltage value to the first voltage value, and
determine, using a predefined relationship between a magnitude of the ratio and a thickness of the edge ring, the thickness of the edge ring corresponding to the determined ratio.

[E14]

The plasma processing apparatus according to E13, wherein
the controller is configured to
control the plasma generator and the gas supply to generate plasma from a process gas in the chamber to process the substrate placed on the substrate support, and
control the plasma generator and the gas supply to generate plasma from a cleaning gas in the chamber to dry clean the chamber, and
(a), (b), and (c) are performed immediately after the dry cleaning.

[E15]

The plasma processing apparatus according to any one of E11 to E14, wherein
the pulse generator is configured to generate the pulse of the direct current voltage being a pulse of a negative direct current voltage.

[E16]

The plasma processing apparatus according to any one of E11 to E15, wherein
the controller is configured to apply, in response to the amount of wear being greater than a first threshold, a voltage from a power supply to the edge ring to correct a thickness of a sheath above the edge ring during generation of the plasma in the chamber with the substrate placed on the substrate support.

[E17]

The plasma processing apparatus according to any one of E11 to E15, wherein
the controller is configured to change, in response to the amount of wear being greater than a first threshold, at least one parameter during generation of the plasma in the chamber with the substrate placed on the substrate support, and the at least one parameter is selected from the group consisting of a power level of radio-frequency power for generating the plasma, a voltage level of the pulse of the direct current voltage applied to the first electrode, a voltage level of the pulse of the direct current voltage applied to the second electrode, a flow rate of a gas supplied into the chamber, a pressure in the chamber, a pressure of a heat transfer gas supplied to a gap between the substrate support and the substrate, and an in-plane temperature distribution at the substrate support.

[E18]

The plasma processing apparatus according to E16 or E17, wherein
the controller is configured to provide a notification of a time to replace the edge ring in response to the amount of wear being greater than a second threshold, and the second threshold is greater than the first threshold.

[E19]

The plasma processing apparatus according to E16 or E17, wherein the controller is configured to control the gas supply to supply, in response to the amount of wear being greater than a second threshold greater than the first threshold, a cleaning gas into the chamber to clean the chamber with loading of the substrate into the chamber being stopped.

[E20]

A substrate processing system, comprising:

the plasma processing apparatus according to E16 or E17; and a vacuum transfer module including a transfer robot, the vacuum transfer module being connected to the chamber in the plasma processing apparatus, wherein the controller is configured to control the vacuum transfer module to unload, in response to the amount of wear being greater than a second threshold greater than the first threshold, the edge ring from the chamber by the transfer robot with a space in the chamber remaining decompressed to replace the edge ring with loading of the substrate into the chamber being stopped.

The exemplary embodiments according to the disclosure have been described by way of example, and various changes may be made without departing from the scope and spirit of the disclosure. The exemplary embodiments described above are thus not restrictive, and the true scope and spirit of the disclosure are defined by the appended claims.

What is claimed is:

1. A method for determining an amount of wear of an edge ring, the method comprising:

(a) generating plasma in a chamber in a plasma processing apparatus, the plasma processing apparatus including a substrate support in the chamber, the substrate support including a first portion to support a substrate placed on the substrate support and a second portion to support the edge ring placed on the substrate support, the first portion being a central portion of the substrate support and including a first electrode therein, the second portion being an annular portion of the substrate support, surrounding the first portion, and including a second electrode therein;

(b) cyclically applying, to draw ions from the plasma to the substrate support, a pulse of a direct current voltage to the first electrode and the second electrode during generation of the plasma in (a); and (c) determining the amount of wear of the edge ring based on a first voltage value of the first electrode and a second voltage value of the second electrode measured when the pulse is applied to the first electrode and the second electrode in (b).

2. The method according to claim 1, wherein the determining the amount of wear of the edge ring includes determining a ratio of a time change of the second voltage value to a time change of the first voltage value, determining, using a predefined relationship between a magnitude of the determined ratio and a wear rate of the edge ring, the wear rate of the edge ring corresponding to the determined ratio, and determining the amount of wear of the edge ring by determining a product of the determined wear rate of the edge ring and a duration for which the edge ring is exposed to the plasma.

3. The method according to claim 1, wherein (c) further includes determining a ratio of the second voltage value to the first voltage value, and determining, using a predefined relationship between a magnitude of the ratio and a thickness of the edge ring, the thickness of the edge ring corresponding to the determined ratio.

4. The method according to claim 3, further comprising:

processing the substrate placed on the substrate support with plasma generated from a process gas in the chamber; and dry cleaning the chamber after the processing the substrate, wherein (a), (b), and (c) are performed after the dry cleaning.

5. The method according to claim 1, wherein the pulse of the direct current voltage is a pulse of a negative direct current voltage.

6. The method according to claim 1, further comprising:

applying, in response to the amount of wear being greater than a first threshold, a voltage to the edge ring to correct a thickness of a sheath above the edge ring during generation of the plasma in the chamber with the substrate placed on the substrate support.

7. The method according to claim 1, further comprising:

changing, in response to the amount of wear being greater than a first threshold, at least one parameter during generation of the plasma in the chamber with the substrate placed on the substrate support, the at least one parameter being selected from the group consisting of a power level of radio-frequency power for generating the plasma, a voltage level of the pulse of the direct current voltage applied to the first electrode, a voltage level of the pulse of the direct current voltage applied to the second electrode, a flow rate of a gas supplied into the chamber, a pressure in the chamber, a pressure of a heat transfer gas supplied to a gap between the substrate support and the substrate, and an in-plane temperature distribution at the substrate support.

8. The method according to claim 6, further comprising:

providing a notification of a time to replace the edge ring in response to the amount of wear being greater than a second threshold, the second threshold being greater than the first threshold.

9. The method according to claim 6, further comprising:

cleaning, in response to the amount of wear being greater than a second threshold greater than the first threshold, the chamber with loading of the substrate into the chamber being stopped.

10. The method according to claim 6, further comprising:

replacing, in response to the amount of wear being greater than a second threshold greater than the first threshold, the edge ring with loading of the substrate into the chamber being stopped, wherein the edge ring is unloaded from the chamber by a transfer robot located in a vacuum transfer module connected to the chamber with a space in the chamber remaining decompressed.

11. A plasma processing apparatus, comprising:

a chamber;

a substrate support in the chamber, the substrate support including a first portion to support a substrate placed on the substrate support and a second portion to support an edge ring placed on the substrate support, the first portion being a central portion of the substrate support and including a first electrode therein, the second portion being an annular portion of the substrate support, surrounding the first portion, and including a second electrode therein;

a gas supply configured to supply a gas into the chamber;

a plasma generator configured to generate plasma from the gas in the chamber;

a pulse generator configured to cyclically apply a pulse of a direct current voltage to the first electrode and the second electrode;

a sensor configured to measure a voltage value of the first electrode and a voltage value of the second electrode; and a controller configured to (a) control the gas supply and the plasma generator to generate plasma in the chamber, (b) control the pulse generator to cyclically apply, during generation of the plasma in (a), the pulse of the direct current voltage to the first electrode and the second electrode to draw ions from the plasma to the substrate support, and (c) determine an amount of wear of the edge ring based on a first voltage value of the first electrode and a second voltage value of the second electrode measured when the pulse is applied to the first electrode and the second electrode in (b).

12. The plasma processing apparatus according to claim 11, wherein in determining the amount of wear of the edge ring in (c), the controller is configured to determine a ratio of a time change of the second voltage value to a time change of the first voltage value, determine, using a predefined relationship between a magnitude of the determined ratio and a wear rate of the edge ring, the wear rate of the edge ring corresponding to the determined ratio, and determine the amount of wear of the edge ring by determining a product of the determined wear rate of the edge ring and a duration for which the edge ring is exposed to the plasma.

13. The plasma processing apparatus according to claim 11, wherein the controller is further configured to determine a ratio of the second voltage value to the first voltage value, and determine, using a predefined relationship between a magnitude of the ratio and a thickness of the edge ring, the thickness of the edge ring corresponding to the determined ratio.

14. The plasma processing apparatus according to claim 13, wherein the controller is further configured to control the plasma generator and the gas supply to generate plasma from a process gas in the chamber to process the substrate placed on the substrate support, and control the plasma generator and the gas supply to generate plasma from a cleaning gas in the chamber to dry clean the chamber, and (a), (b), and (c) are performed after the dry cleaning.

15. The plasma processing apparatus according to claim 11, wherein the pulse generator is configured to generate a pulse of a negative direct current voltage as the pulse of the direct current voltage.

16. The plasma processing apparatus according to claim 11, wherein the controller is further configured to apply, in response to the amount of wear being greater than a first threshold, a voltage from a power supply to the edge ring to correct a thickness of a sheath above the edge ring during generation of the plasma in the chamber with the substrate placed on the substrate support.

17. The plasma processing apparatus according to claim 11, wherein the controller is further configured to change, in response to the amount of wear being greater than a first threshold, at least one parameter during generation of the plasma in the chamber with the substrate placed on the substrate support, and the at least one parameter is selected from the group consisting of a power level of radio-frequency power for generating the plasma, a voltage level of the pulse of the direct current voltage applied to the first electrode, a voltage level of the pulse of the direct current voltage applied to the second electrode, a flow rate of a gas supplied into the chamber, a pressure in the chamber, a pressure of a heat transfer gas supplied to a gap between the substrate support and the substrate, and an in-plane temperature distribution at the substrate support.

18. The plasma processing apparatus according to claim 16, wherein the controller is further configured to provide a notification of a time to replace the edge ring in response to the amount of wear being greater than a second threshold, and the second threshold is greater than the first threshold.

19. The plasma processing apparatus according to claim 16, wherein the controller is further configured to control the gas supply to supply, in response to the amount of wear being greater than a second threshold greater than the first threshold, a cleaning gas into the chamber to clean the chamber with loading of the substrate into the chamber being stopped.

20. A substrate processing system, comprising:

the plasma processing apparatus according to claim 16; and a vacuum transfer module including a transfer robot, the vacuum transfer module being connected to the chamber in the plasma processing apparatus, wherein the controller is configured to control the vacuum transfer module to unload, in response to the amount of wear being greater than a second threshold greater than the first threshold, the edge ring from the chamber by the transfer robot with a space in the chamber remaining decompressed to replace the edge ring with loading of the substrate into the chamber being stopped.

* * * * *